(12) United States Patent
Ketterson et al.

(10) Patent No.: US 7,130,124 B2
(45) Date of Patent: Oct. 31, 2006

(54) AVERAGE PITCH GRATINGS FOR OPTICAL FILTERING APPLICATIONS

(75) Inventors: Andrew A. Ketterson, Dallas, TX (US); Jose L. Jimenez, Dallas, TX (US); Christopher T. Youtsey, Dallas, TX (US)

(73) Assignee: Tri Quint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/427,790

(22) Filed: Apr. 30, 2003

(65) Prior Publication Data

US 2004/0218275 A1    Nov. 4, 2004

(51) Int. Cl.
*G02B 5/18* (2006.01)
(52) U.S. Cl. .................. 359/569; 359/900; 385/14; 372/102
(58) Field of Classification Search .......... 359/575, 359/569, 566, 900; 385/10, 14; 372/96, 372/102
See application file for complete search history.

(56) References Cited

U.S. PATENT DOCUMENTS

| | | | | |
|---|---|---|---|---|
| 5,056,099 A | * | 10/1991 | Bradley | 372/49.01 |
| 5,325,392 A | * | 6/1994 | Tohmori et al. | 372/96 |
| 5,497,393 A | * | 3/1996 | Lee | 372/96 |
| 6,018,534 A | * | 1/2000 | Pan et al. | 372/6 |
| 6,608,855 B1 | * | 8/2003 | Hwang et al. | 372/96 |

OTHER PUBLICATIONS

Rishton et al., "Tunable Distributed-Feedback Laser Gratings For Telecom Applications, Manufactured By Electron-Beam Lithography", J. Vac. Sci. Technol. B 20(6), Nov./Dec. 2002, 2002 American Vacuum Society, pp. 2749-2752.

* cited by examiner

*Primary Examiner*—Arnel C. Lavarias
(74) *Attorney, Agent, or Firm*—Bever Hoffman & Harms

(57) ABSTRACT

A pitch averaging Bragg grating includes a plurality of grating peaks spaced by different pitch values. By selecting the different pitch values to have an average pitch value equal to a target pitch value, the pitch averaging Bragg grating can be made to perform like a constant pitch Bragg grating having a fixed pitch at the target pitch value. The different pitch values can be multiples of the minimum placement resolution of a production tool to be used to produce the Bragg grating. The pitch averaging Bragg grating can be used in place of constant pitch Bragg gratings in optical devices and systems, such as DFB lasers, DBR lasers, optical spectral filters, multi-wavelength laser arrays, and WDM systems.

26 Claims, 14 Drawing Sheets

AVERAGE PITCH GRATINGS FOR OPTICAL FILTERING APPLICATIONS

BACKGROUND OF THE INVENTION

1. Field of the Invention

The invention relates to the field of optics, and more specifically, to methods and structures for improving the manufacturability of Bragg gratings and systems that include Bragg gratings.

2. Related Art

Optical spectral filters are a critical component in modern optical systems. A Bragg grating is a type of optical spectral filter that is often used to filter and select specific wavelengths in optical systems. Conventional Bragg gratings are formed by a series of evenly spaced grating peaks that reflect a particular wavelength of light. Because of this fixed-pitch characteristic, conventional Bragg gratings can be referred to as "constant pitch" Bragg gratings.

FIG. 1A shows a conventional constant pitch Bragg grating 121A that includes a plurality of grating peaks 122A formed on a substrate 120A. Grating peaks 122A are all spaced equally from one another at a fixed pitch P_BRAGG. When pitch P_BRAGG satisfies the "Bragg condition" for a particular wavelength, it will strongly reflect that wavelength of light. The Bragg condition for the fundamental wavelength is defined by the following:

$$P\_BRAGG = \lambda/(2 * n_{eff}) \quad (1)$$

where $\lambda$ is the wavelength of the reflected light and $n_{eff}$ is the effective refractive index of the optical waveguide. Because of this relationship, pitch P_BRAGG can be referred to as the "Bragg pitch" for wavelength $\lambda$. Similarly, wavelength $\lambda$ can be referred to as the "Bragg wavelength" for pitch P_BRAGG.

Distributed-feedback (DFB) lasers make use of this filtering characteristic of Bragg gratings to generate single wavelength lasers. FIG. 1B shows a conventional DFB laser 100 that could be produced using constant pitch Bragg grating 121 shown in FIG. 1A. DFB laser 100 includes an active region 110 formed between an upper boundary region 120 and a lower boundary region 130, which in turn is formed on a substrate 140. An upper contact is formed over upper boundary region 120, while a lower contact 150 over the bottom surface of substrate 140. Upper boundary region 120 includes constant pitch Bragg grating 121.

Upper boundary region 120, active region 110, and lower boundary region 130 form a laser diode structure that produces light emission within active region 110 when a current flows between upper contact 160 and lower contact 150. Cleaved ends 111 and 112 of the laser diode structure and constant pitch Bragg grating 121 form a resonating cavity that allows lasing to take place within active region 110, and a laser beam 190 is emitted, once sufficient current flows between upper contact 160 and lower contact 150. Without a grating the laser cavity will support a plurality of lasing wavelengths. The Bragg grating 121 performs a filtering function allowing the laser to lase at just a single wavelength, and thus discriminate between all of the other longitudinal modes of the cavity.

However, in a typical DFB laser, lasing can actually occur in one of two modes. FIG. 2A shows an example transmission curve T121 for constant pitch Bragg grating 121 shown in FIG. 1A. A stop band S1 (sometimes referred to as a "reject band") bounded by wavelengths WL1 and WL2 indicates the region of low transmissivity for the Bragg grating.

Lasing can only occur at a transmission maximum within stop band S1. Specifically, lasing will occur at either wavelength WL1 or WL2, the two transmission maxima at either side of stop band S1. The actual lasing wavelength (mode), or the hopping characteristics between two modes, depends on many fabrication parameters such as waveguide width, material composition, and in particular, cleaving accuracy for the ends of the laser (e.g., cleaved ends 111 and 112 in FIG. 1B). Unfortunately, even state of the art cleaving technology is several generations away from being able to provide the cleaving accuracy that is required to produce a predictable lasing mode. Consequently, conventional DFB laser production is plagued by low yields, and by a manufacturing process where every single DFB laser needs to be tested to determine its lasing characteristics.

To overcome this bi-modal lasing problem, conventional Bragg gratings sometimes include a phase shift gap to adjust the transmission characteristics of a Bragg grating within its stop band. Specifically, the phase shift gap is intended to introduce an additional tranmission maximum in the center of the stop band. A phase shift gap is an enlarged spacing between two grating peaks in a Bragg grating that is designed to introduce a quarter wavelength shift between the between the grating peak groupings on either side of the phase shift gap (i.e., the light reflected by one of the grating peak groupings is dephased by 180° from the light reflected by the other grating peak grouping). Consequently, a Bragg grating that includes such a phase shift gap can be referred to as a quarter wavelength shifted ("$\lambda$/4-PS") Bragg grating.

FIG. 2B shows a conventional $\lambda$/4-PS constant pitch Bragg grating 221. $\lambda$/4-PS constant pitch Bragg grating 221 formed on a substrate 220 is substantially similar to constant pitch Bragg grating 121 shown in FIG. 1, except that Bragg grating 221 includes a central phase shift gap G_PHASE. Phase shift gap G_PHASE divides grating peaks 222 into two filter groupings 221-1 and 221-2. Within filter groupings 221-1 and 221-2, all grating peaks 222 are spaced by pitch value P_BRAGG. Phase shift gap G_PHASE is sized to introduce a quarter wavelength shift between filter groupings 221-1 and 221-2. This quarter wavelength shift requires that phase shift gap G_PHASE be half a period longer than the fixed pitch P_BRAGG (i.e., G_PHASE=1.5 times P BRAGG).

Note that $\lambda$/4-PS constant pitch Bragg grating 221 is still considered a constant pitch Bragg grating because phase shift gap G_PHASE does not adjust the Bragg wavelength of the Bragg grating. Filter groupings 221-1 and 221-2 are so named because they perform the actual "filtering" within Bragg grating 221. In other words, the constant pitch filter groupings 221-1 and 221-2 determine the position of the stop band for Bragg grating 221, just as the constant pitch of Bragg grating 121 shown in FIG. 1A determines the position of the stop band for Bragg grating 121. Phase shift gap G_PHASE does not change the position of that stop band. Rather, phase shift gap G_PHASE merely adjusts the behavior of the reflectivity curve within that stop band.

FIG. 2C shows an example transmission curve T221 for the $\lambda$/4-PS constant pitch Bragg grating 221 shown in FIG. 2B. Transmission curve T221 is superimposed on transmission curve T121 (dotted line) from FIG. 2A for comparative purposes. A stop band S2 (bounded by wavelengths WS1 and WS2) indicates the region of low transmissivity for transmission curve T221. Note that while stop band S2 is wider than stop band S1 shown in FIG. 2A, the two stop bands have the same location (e.g., both are centered around a wavelength WL3), because the constant pitch of filter groupings 221-1 and 221-2 are the same as the constant pitch of Bragg grating 121 (i.e., P_BRAGG). However, the introduction of phase shift gap G_PHASE into Bragg grating 221 causes transmission curve T221 to have a maximum within stop band S2 at wavelength WL3. Wavelength WL3 will therefore always be the dominant mode provided by the Bragg grating, and a DFB laser that incorporates λ/4-PS constant pitch Bragg grating 221 will not be affected by cleaved end characteristics, and will lase only at wavelength WL3.

Note also that the contrast (i.e., the difference between maximum and minimum tranmission) of the transmission curve T221 is significantly reduced relative to transmission curve T121. This is due to the introduction of phase shift gap G_PHASE. Additional phase shift gaps can further reduce the tranmission contrast which in turn can unacceptably reduce the wavelength discrimination of the device. Furthermore, incorporating multiple phase shift gaps into a conventional Bragg grating can significantly complicate the manufacturing process, since a tool that has been calibrated to produce the fixed Bragg pitch will likely require re-calibration or re-adjustment at each phase shift gap (note that even adding a single phase shift gap can significantly increases the manufacturing complexity for conventional Bragg gratings). Therefore, conventional λ/4-PS Bragg gratings included at most a single quarter wavelength phase shift gap (although some academic research has been done on up to three identical phase shift gaps).

Bragg gratings are typically manufactured in one of three ways: (1) interference lithography, (2) photolithography, or (3) e-beam lithography. In interference lithography, two coherent beams are used to create a standing wave that exposes a periodic pattern into a resist layer. In photolithography, the desired grating pattern is incorporated into a photomask, which is then used to expose a photosensitive layer. And in e-beam lithography, an electron beam is scanned directly across an electron-sensitive layer to create the desired pattern.

Each of these techniques is constrained by a minimum placement resolution (i.e., the accuracy with which a tool can address locations on the target piece) that limits the grating pitch values that can be produced. Typically, e-beam lithography is used to manufacture Bragg gratings, due to the generally better placement resolution characteristics of such tools. For example, the minimum placement resolution of a particular e-beam lithography tool could be 10 nm, in which case the grating pitch values produced by that tool would be limited to multiples of 10 nm. On the other hand, a different e-beam lithography tool might have a minimum placement resolution of 25 nm, in which case the grating pitch values produced by that tool would be limited to multiples of 25 nm.

This type of tool-specific limitation can make manufacturing a conventional Bragg grating problematic, since the desired Bragg pitch may not necessarily be compatible with the minimum placement resolution of a particular tool. For example, communication on the International Telecommunications Union (ITU) grid (ITU-T G.694.1 (2002)) at 195 THz requires a 1537.40 nm wavelength laser, which in turn requires a 240.144 nm constant pitch value (using equation (1) and assuming an effective refractive index neff of 3.201). Unfortunately, the typical minimum placement resolutions of modern lithography tools do not coincide with this pitch value.

For example, the LEICA™ EBPG-5 and HITACHI™ HL800D lithography tools have minimum placement resolutions of 5 nm and 10 nm, respectively. Therefore, those tools could write grating pitches that are multiples of their minimum placement resolution; i.e., 240 nm, 245 nm, or 250 nm pitch values would be achievable with the LEICA™ tool, while 240 nm and 250 nm pitch values would be achievable with the HITACHI™ tool. However, the 240.354 nm target pitch (which is not a multiple of 5 nm or 10 nm) would not be achievable with either tool, based on their standard minimum placement resolutions. This limitation can make DFB laser production for modern communication systems very difficult, since such systems typically require extremely fine wavelength control.

For instance, the channel adjacent to the 195 THz channel on the ITU grid is 194.9 THz (1538.19 nm). Using the same assumptions that were applied to calculate the Bragg grating pitch for the 195 THz channel, the 194.9 THz channel requires a 240.267 nm pitch. Thus, the difference between pitch values for the adjacent channels is 0.123 nm, which is far less than the minimum placement resolution of modern e-beam lithography tools.

One technique to overcome this minimum placement resolution problem is to apply a small scaling correction factor to the deflection system of an e-beam lithography tool. For example, a +0.06% correction to field magnification is sufficient to change the pitch value written by an e-beam lithography tool from 240 nm to the target 240.144 nm. State of the art e-beam lithography systems can have scaling accuracies better than 0.01%, making this approach a workable solution.

However, this type of scaling correction technique can be extremely difficult and time-consuming. A different scaling correction would be required before writing each desired pitch value, making single-pass writing operations for multiple Bragg gratings (having different fundamental wavelengths) impossible. Also, depending on the design of the e-beam lithography tool, additional calibration corrections would be required to minimize field and subfield stitching errors.

Another technique to overcome the minimum placement resolution of an e-beam lithography tool is to apply carefully controlled electron doses at selected locations that are compatible with the minimum placement resolution of the tool ("on-grid locations"). These electron doses are sized to create accumulated effective dose peaks at non-resolvable locations ("off-grid locations"). This technique, known as weighted-dose allocation variable-pitch e-beam lithography (WAVE) requires an accurate model of the forward and backward-scattered electron energy distributions in the resist and an algorithm to calculate the individual sub-dose values and locations. The WAVE technique can therefore be even more complicated than the scaling correction technique.

Accordingly, it is desirable to provide a technique for producing Bragg gratings that are compatible with standard lithography tool resolution requirements, but can also provide arbitrarily selectable wavelength filtering properties.

SUMMARY OF THE INVENTION

The invention includes a variable pitch distribution for the grating peaks of a Bragg grating. In an exemplary embodiment, the individual pitch values in the pitch distribution are all selected to be a multiple of a minimum tool resolution value. The pitch values in the pitch distribution are further selected to have an average pitch value equal to a target pitch value, the target pitch value being equal to a constant pitch value providing a desired Bragg grating performance.

Because the average pitch of the pitch distribution is equal to this target pitch, this "pitch averaging" Bragg grating will perform like a constant pitch Bragg grating having a fixed pitch equal to the target pitch. However, the pitch averaging Bragg grating is much easier to manufacture, since its pitch values will always be multiples of the minimum placement resolution of the tool being used to produce the Bragg grating.

Hence, in this embodiment, the need for the complex techniques used in conventional Bragg grating production, such as scaling corrections or WAVE, is eliminated. In addition, all the Bragg grating patterns on the same die (or wafer) may be exposed in a single writing pass—i.e., a writing pass that does not involve any recalibration or tool adjustment between the writing of each Bragg grating. Also, since the minimum placement resolution of a tool will typically be a known parameter, the pitch dimensions may be defined directly in the original source or CAD (computer aided design) file for the Bragg grating, instead of having to wait for the results of specialized adjustment and calibration operations on the tool.

According to another exemplary embodiment of the invention, a method for creating a Bragg grating involves selecting a target pitch, specifying a minimum tool resolution, defining a pitch distribution that satisfies the minimum placement resolution requirements and also averages out to equal the target pitch, and then producing the Bragg grating using that pitch distribution. The pitch-averaging technique can also be applied to chirped and other pitch-modulated grating schemes to simplify the manufacture of such structures.

According to another exemplary embodiment of the invention, a phase shift gap or multiple phase shift gaps can be included in a pitch averaging Bragg grating to improve DFB laser stability and yield. According to various other embodiments of the invention, a pitch averaging Bragg grating can be incorporated into DBR (distributed Bragg reflector) lasers, optical spectral filters, WDM (wavelength division multiplexing) systems, and multiple-wavelength laser arrays to improve manufacturability. Pitch averaging Bragg gratings are particularly beneficial in systems that incorporate multiple Bragg gratings on a single die, since the multiple Bragg gratings (having different average pitch values) can be produced in a single writing pass.

The present invention will be more fully understood in view of the following description of the exemplary embodiments and the drawings thereof.

DETAILED DESCRIPTION

Figure 3A:
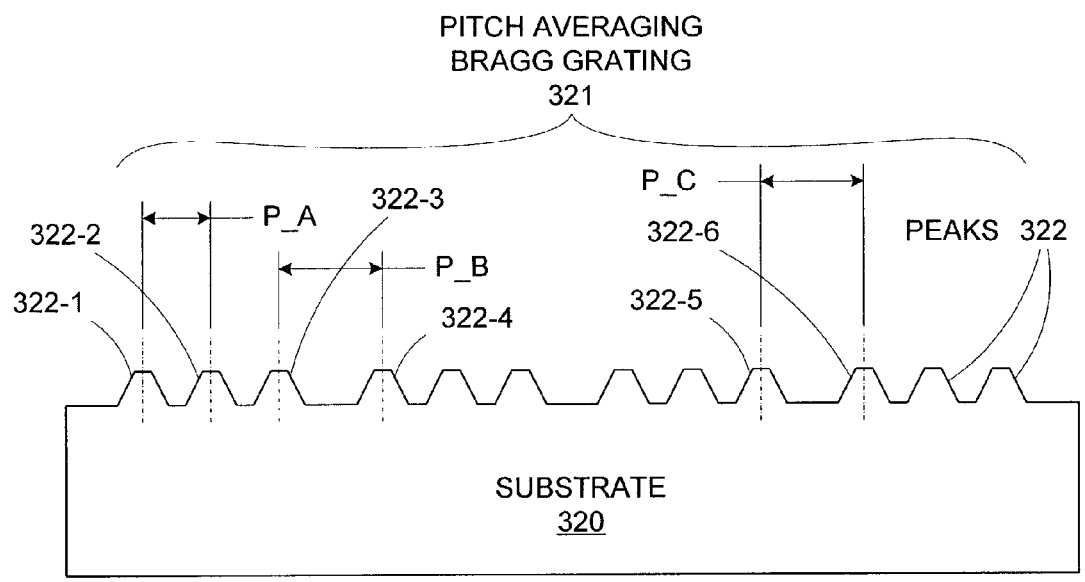
FIG. 3A is a diagram of a pitch averaging Bragg grating in accordance with an embodiment of the invention.

The invention incorporates an average pitch methodology into the design and construction of Bragg gratings, thereby significantly simplifying the manufacturing process. For instance, FIG. 3A shows a pitch averaging Bragg grating 321 in accordance with an embodiment of the invention. Pitch averaging Bragg grating 321 is formed on a substrate 320, and includes a plurality of grating peaks 322.

The pitch distribution of grating peaks 322 includes several different pitch values. For example, grating peaks 322-1 and 322-2 are separated by a pitch value P_A, while grating peaks 322-3 and 322-4 are separated by a pitch value P_B that is different than pitch value P_A. Similarly, a pitch value P_C separating grating peaks 322-5 and 322-6 could be different than both pitch P_A and P_B. According to various embodiments of the invention, a pitch averaging Bragg grating can have a pitch distribution that includes any number of different pitch values.

By selecting the pitch distribution of Bragg grating 321 to have an average pitch value equal to a target pitch, pitch averaging Bragg grating 321 will perform like a constant pitch Bragg grating that has a constant pitch equal to the target pitch. Therefore, since none of the pitch values in the pitch distribution have to be equal to the target pitch, those pitch values can be selected to be multiples of a minimum took resolution, thereby greatly enhancing manufacturability of the pitch averaging Bragg grating.

For example, as noted above, the ITU grid channel at 195 THz requires a 1538.40 nm laser, which in turn would require a Bragg grating pitch of 240.144 (in a material having an effective refractive index of 3.201). A lithography tool having a minimum placement resolution of 10 nm could be used to write a grating peak pattern having a pitch distribution ("pitch distribution A") formed by a repeating pattern of 69 grating peaks, each of the 69 grating peaks including 68 grating peaks spaced by 240 nm (pitch value) and a single grating peak spaced by 250 nm. Note that the location of the 250 nm pitch grating peak can be located anywhere among the other 68 grating peaks. The average pitch value for such a pitch distribution would be 240.147 nm, which could be used to produce a laser wavelength of 1537.421 nm, which is much closer to the target wavelength of 1537.40 nm than any minimum placement resolution-compatible constant pitch Bragg grating output.

Note that in most cases, the more grating peaks over which the different pitch values in a pitch distribution are distributed, the closer the average pitch value can be made to the target pitch value. For example, using the same 240 nm and 250 nm pitch values from the example above, a different pitch distribution ("pitch distribution B") could include a repeating pattern of 68 grating peaks spaced by 240 nm, followed by a grating peak spaced by 250 nm, followed by 69 grating peaks spaced by 240 nm, followed by a grating peak spaced by 250 nm. The average pitch for this pitch distribution would then be 240.1439 nm, which is almost exactly equal to the target pitch value of 240.144.

In most cases, however, such precision will not be required since thermal tuning of the laser will allow one to fine tune the center wavelength of the laser. For example, pitch distribution A described above (0.00125% deviation) would be perfectly suitable for use in an ITU communications system, since the resulting laser wavelength of 1537.421 nm is well within 1 nm of the 195 THz channel (1537.40 nm). Typically, so long as the average pitch value of a pitch averaging Bragg grating is within 1 nm to the target pitch, thermal tuning (within a 10° C. band) will allow the pitch averaging Bragg grating to lock to the tolerance requirements of ITU grid (5% of the ITU grid spacing). Of course, the acceptable offset between the average pitch and the target pitch will depend on the specific requirements of the system in which the pitch averaging Bragg grating will be used.

Figure 3B:
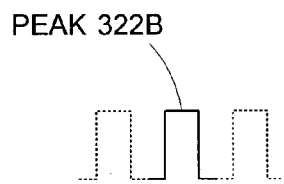
FIGS. 3B, 3C, 3D, 3E, and 3F are example grating peak profiles that can be used with the pitch averaging Bragg grating of FIG. 3A.
Figure 3C:
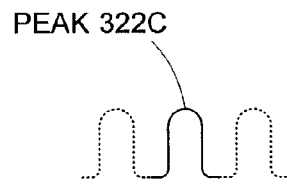
Figure 3D:

Note that while grating peaks 322 shown in FIG. 3A are depicted as trapezoidal-structures for explanatory purposes, a pitch averaging Bragg grating in accordance with the invention can include grating peaks having any shape. For example, FIGS. 3B, 3C, and 3D depict rectangular grating peaks 322B, rounded grating peaks 322C, and sawtooth grating peaks 322D, respectively, any of which could be used in a peak averaging Bragg grating formed in substrate 320 shown in FIG. 3A.

Figure 3E:
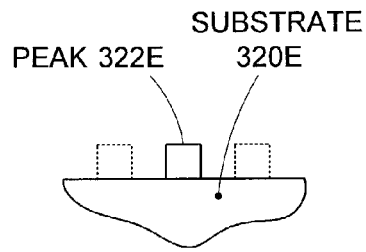

According to other embodiments of the invention, grating peaks for a pitch averaging Bragg grating can be formed from a material deposited onto the surface of a substrate, such as grating peaks 322E on substrate 320E shown in FIG. 3E.

Figure 3F:
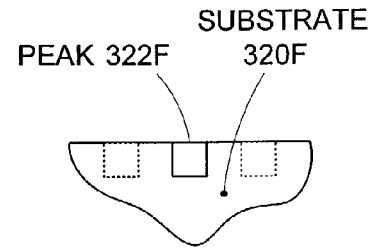

According to other embodiments of the invention, the grating peaks for a pitch averaging Bragg grating do not have to extend above the surface of a substrate. For example, the grating peaks could comprise alternating regions of materials having different refractive indices, such as grating peaks 322F in substrate 320F shown in FIG. 3F. Grating peaks 322F could comprise, for example, irradiated portions of substrate 320F, where substrate 320F comprises an index-changing material. Grating peaks 322F could alternatively comprise, for example, structures formed within substrate 320F using a damascene process. Other grating peak configurations for a pitch averaging Bragg grating will be readily apparent.

Figure 4A:
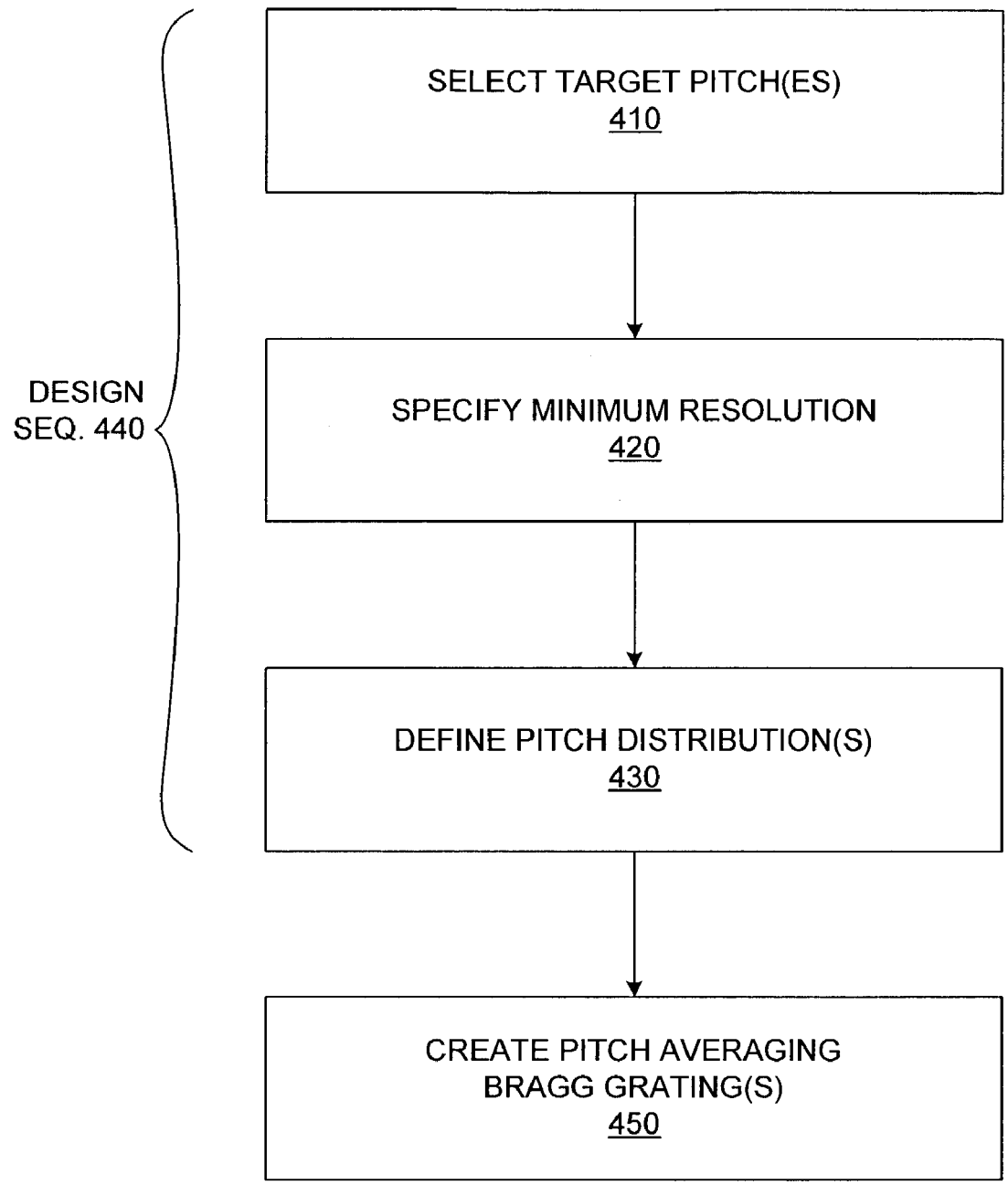
FIG. 4A is a flowchart of a method for designing and creating a pitch averaging Bragg grating in accordance with another embodiment of the invention.

FIG. 4A shows a flowchart of an exemplary process for creating a pitch averaged Bragg grating according to an embodiment of the invention. A target pitch or group of target pitches is selected in a "SELECT TARGET PITCH (ES)" step 410. Each target pitch represents the pitch that would be required to produce a constant pitch Bragg grating having a desired set of optical characteristics.

Then, in a "SPECIFY MINIMUM RESOLUTON" step 420, the minimum placement resolution of the tool to be used to produce the final Bragg grating(s) is determined.

Using this minimum placement resolution, a pitch distribution or a set of pitch distributions having a variety of pitch values is defined in a "DEFINE PITCH DISTRIBUTION (S)" step 430. The variety of pitch values are selected such that each one is equal to a multiple of the minimum placement resolution, and that the average pitch of each pitch distribution is substantially equal to one of the target pitches. As a result, the pitch distributions can be used in Bragg grating designs that provide desired levels of optical performance while remaining highly manufacturable. Steps 410, 420, and 430 can therefore make up a design sequence 440 for creating a pitch averaging Bragg grating design(s) in accordance with an embodiment of the invention.

Using the pitch distribution defined in step 430, a Bragg grating can be produced in a "CREATE PITCH AVERAGING BRAGG GRATING" step 450. Note that the minimum placement resolution of the manufacturing tool used in step 450 has already been incorporated into the pitch distribution(s) via steps 420 and 430. Therefore, the special tool calibrations and adjustments required to produce a similarly performing constant pitch Bragg grating are not necessary. Furthermore, if multiple Bragg gratings with different average pitch values are being produced, the patterns for those multiple Bragg gratings can all be produced without interruption (i.e., in a single writing pass) on the same die, since all the pitch distributions will be compatible with the minimum placement resolution of the manufacturing tool.

Figure 4B:
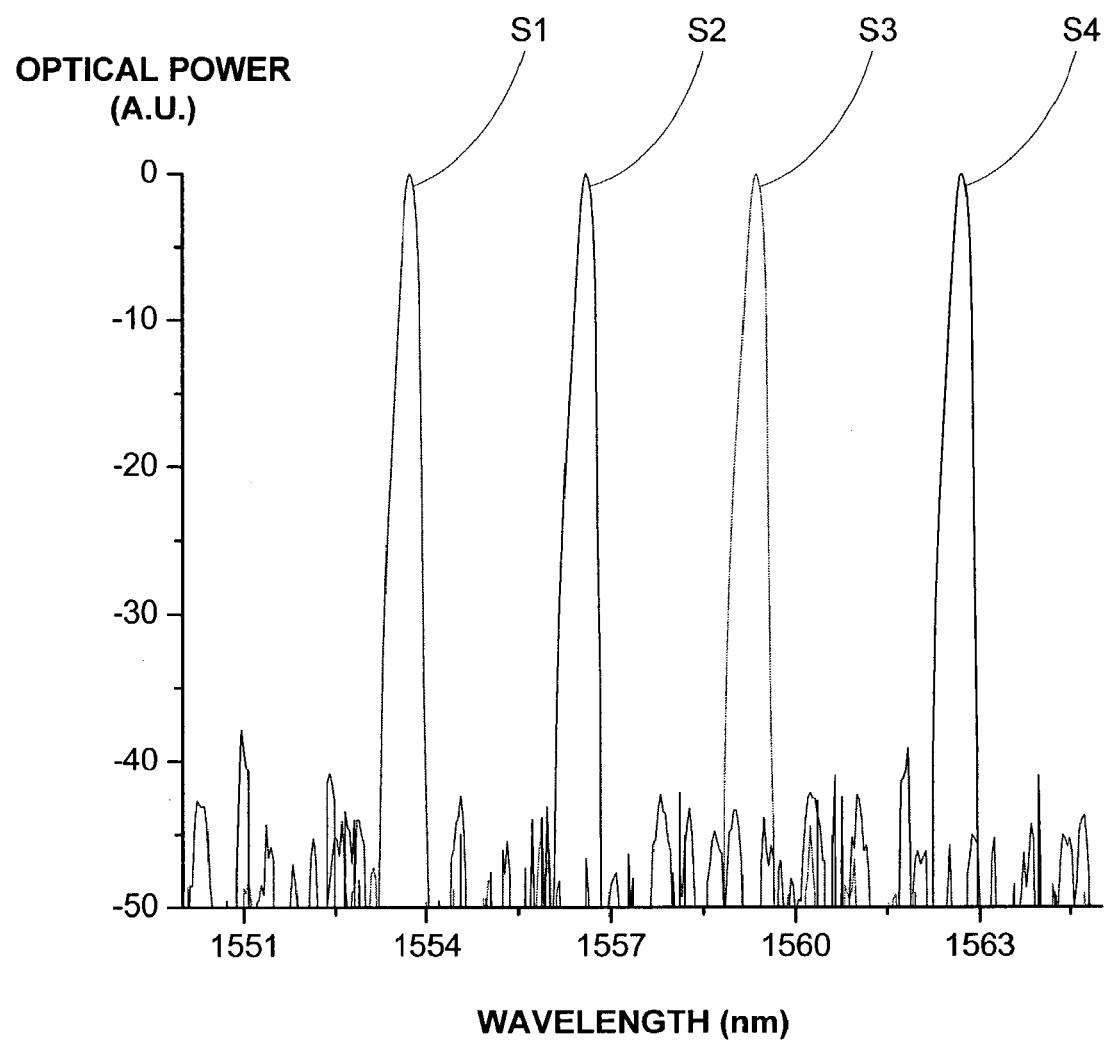
FIG. 4B is a graph of optical spectra for multiple pitch averaging Bragg gratings formed on a single wafer.

For example, FIG. 4B shows the measured spectra S1, S2, S3, and S4 from four DFB lasers formed on the same wafer. The Bragg grating parameters for each of the spectra is provided in Table 1.

TABLE 1

| | Multiple Bragg Grating Data | | | | | | |
|---|---|---|---|---|---|---|---|
| | | | Quantity of Pitch Values at: | | | | |
| Spectrum | Target λ (nm) | Target Pitch (nm) | 230 (nm) | 240 (nm) | 250 (nm) | Avg. Pitch (nm) | Actual λ (nm) |
| S1 | 1553.53 | 239.521 | 36 | 714 | 0 | 239.520 | 1553.53 |
| S2 | 1556.64 | 240.000 | 0 | 750 | 0 | 240.000 | 1556.64 |
| S3 | 1559.75 | 240.479 | 0 | 714 | 36 | 240.480 | 1559.75 |
| S4 | 1562.87 | 240.961 | 0 | 678 | 72 | 240.960 | 1562.87 |

As indicated in Table 1, spectra S1, S3, and S4 represent the response of pitch averaging Bragg gratings, in accordance with various embodiments of the invention. Spectrum S2 represents a conventional constant pitch Bragg grating. Clearly, the pitch averaging Bragg gratings (S1, S3, and S4) exhibit just as accurate a response as does the constant pitch Bragg grating (S2).

Figure 5:
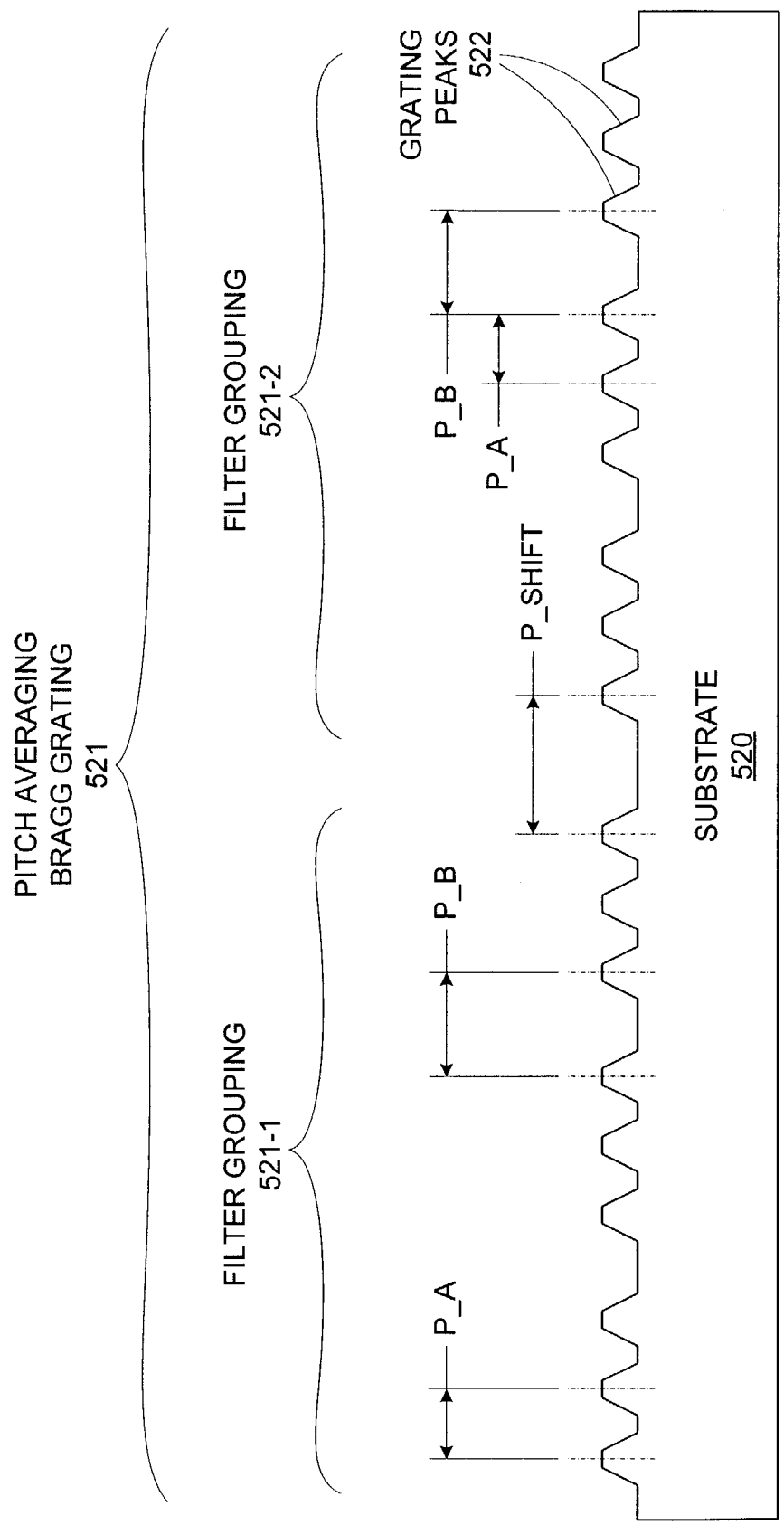
FIG. 5 is a diagram of a pitch averaging Bragg grating that includes a phase shift, in accordance with another embodiment of the invention.

According to another embodiment of the invention, pitch averaging Bragg gratings can also include one or more phase shift gaps. FIG. 5 shows a pitch averaging Bragg grating 521 in accordance with another embodiment of the invention. For example, pitch averaging Bragg grating 521 includes a plurality of grating peaks 522 formed on a substrate 520. Grating peaks 522 are divided into two filter groupings 521-1 and 521-2, separated by a phase shift gap P_SHIFT. Each of the filter groupings includes multiple pitch values, such as pitch values P_A and P_B.

Figure 1A:
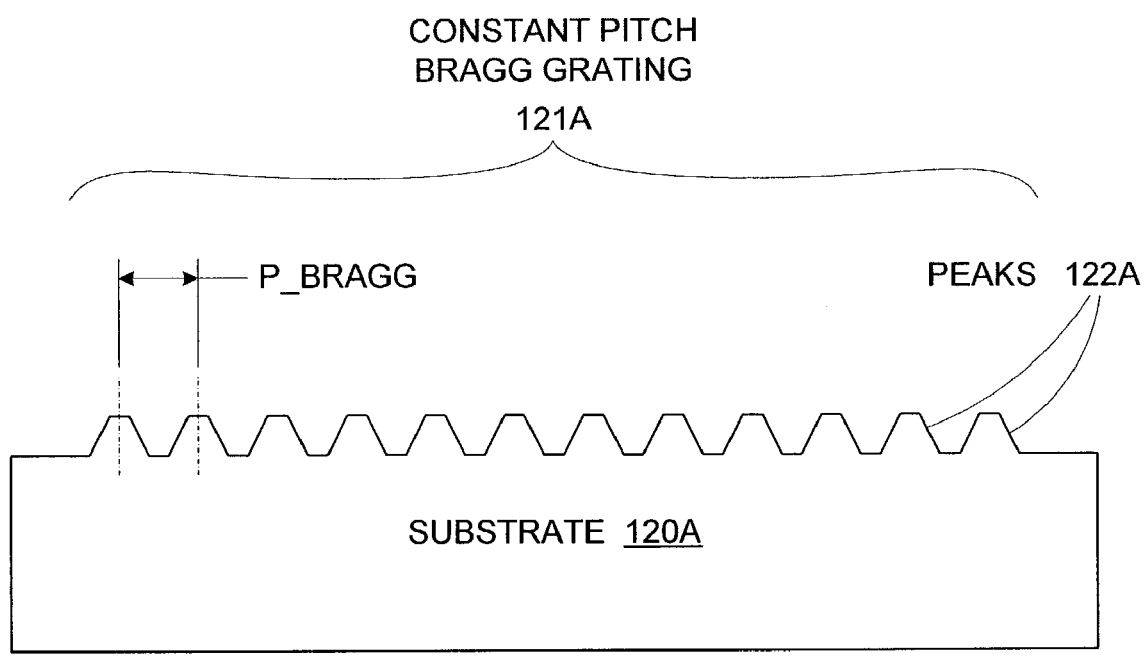
FIG. 1A is a diagram of a conventional constant pitch Bragg grating.
Figure 1B:
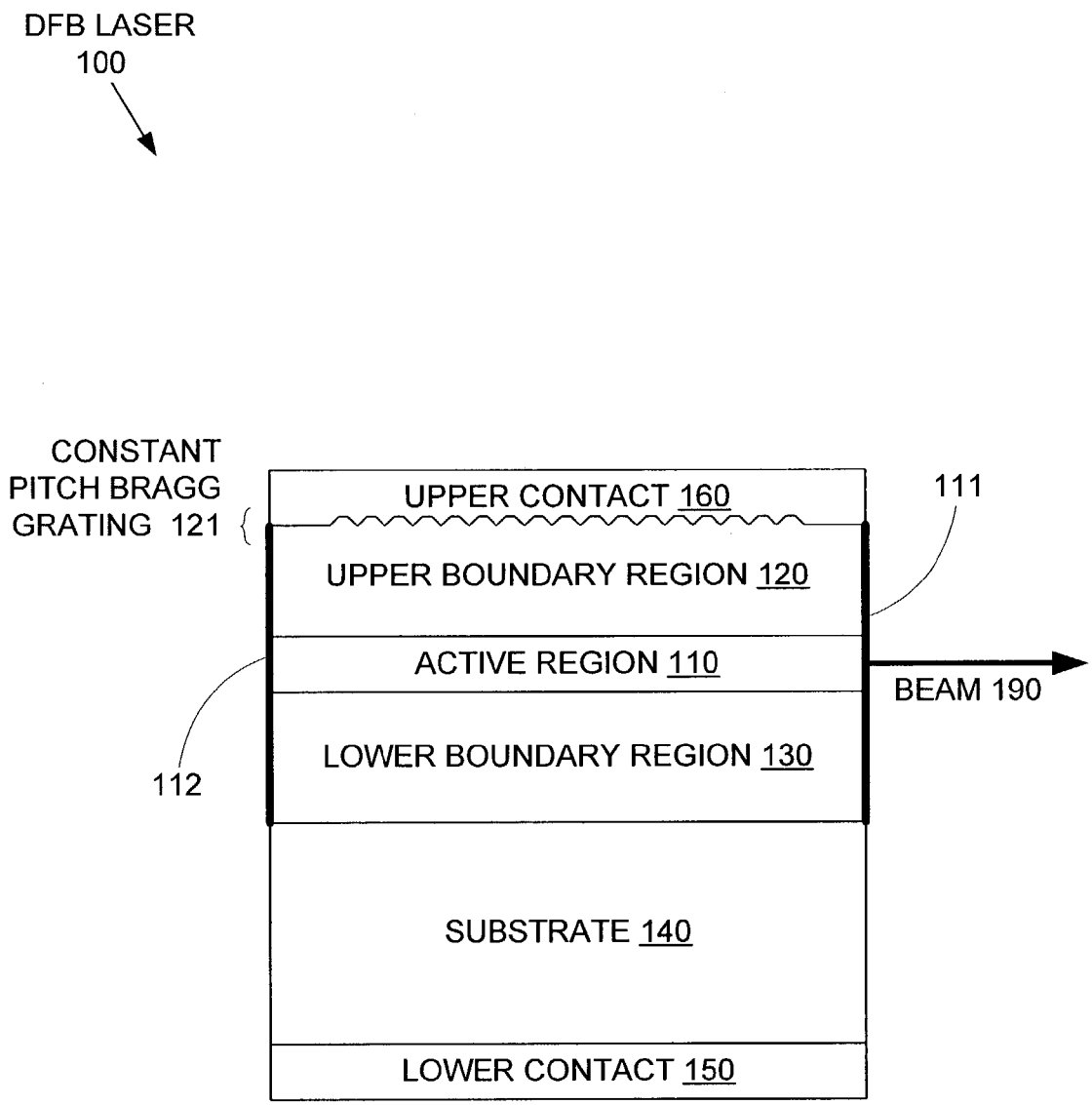
FIG. 1B is a diagram of a conventional DFB laser that includes a constant pitch Bragg grating.
Figure 2A:
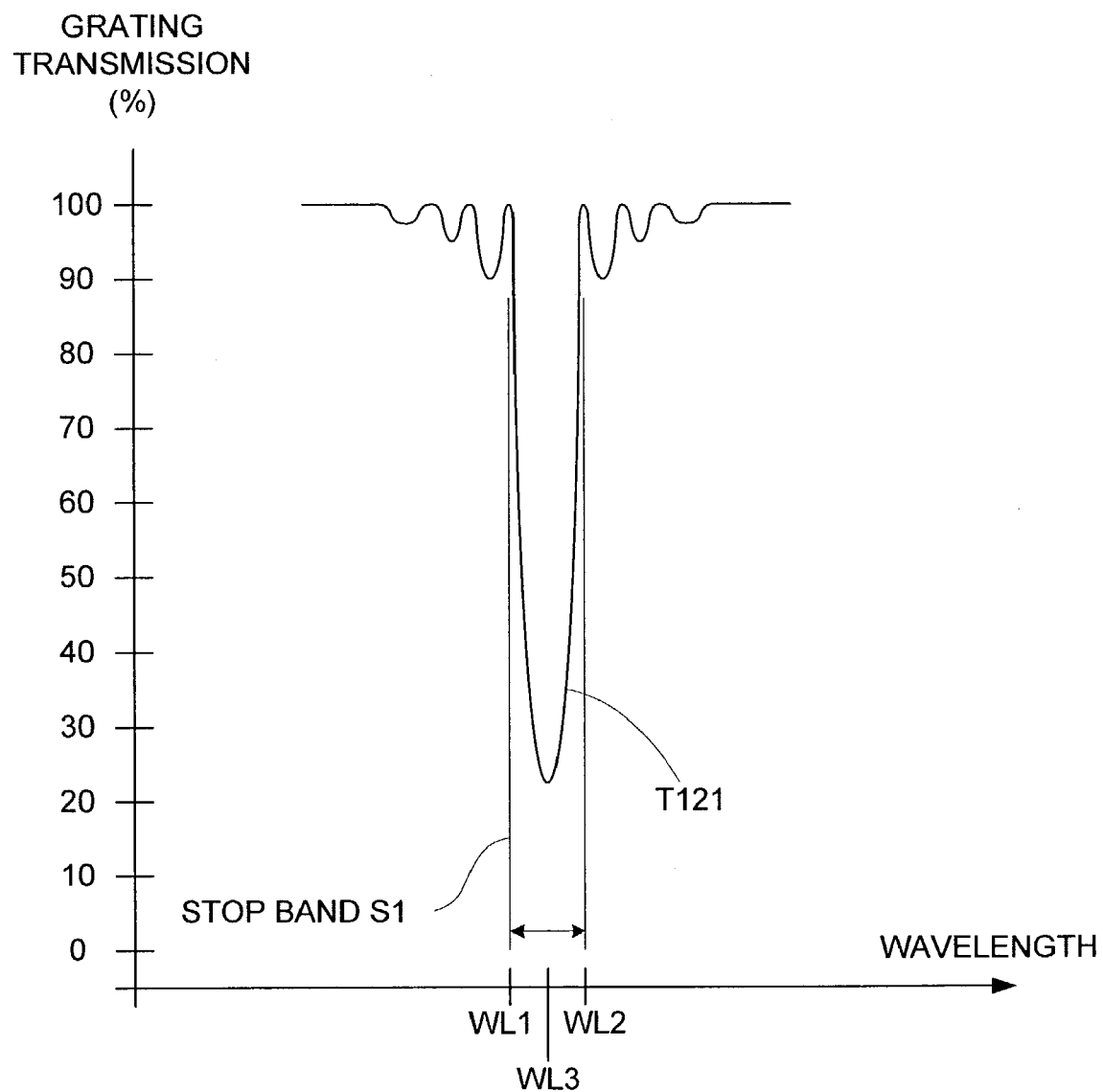
FIG. 2A is a transmission curve for a non-phase shifted Bragg grating.
Figure 2B:
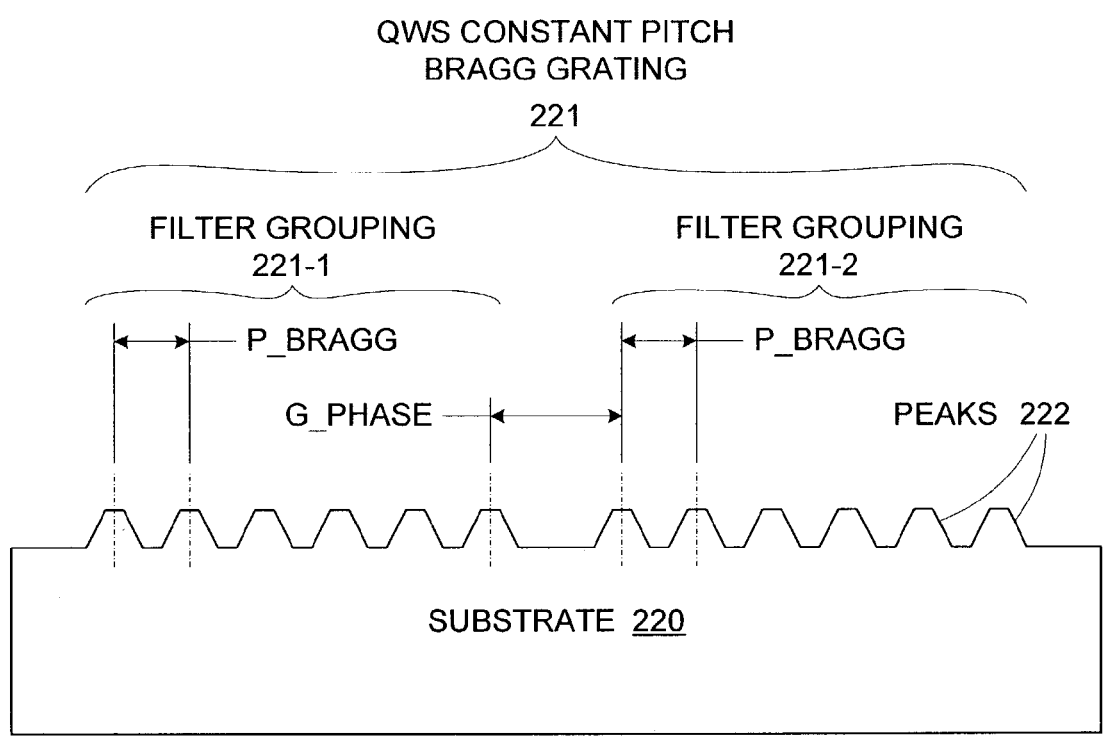
FIG. 2B is a diagram of conventional constant pitch Bragg grating that includes a phase shift.
Figure 2C:
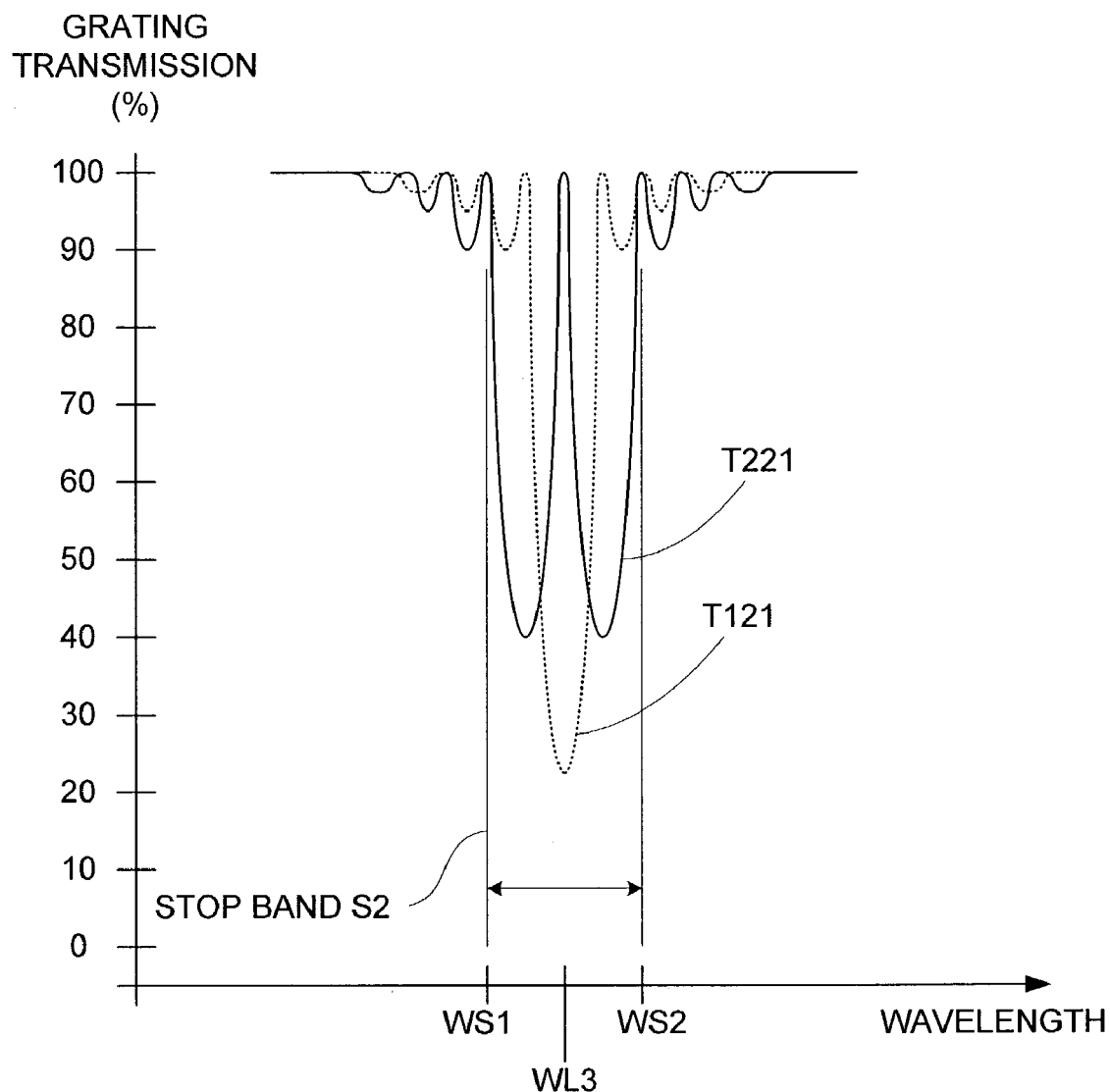
FIG. 2C is a transmission curve for a phase shifted Bragg grating.

Note that the specific pitch distributions for filter groupings 521-1 and 521-2 need not be the same, but both filter groupings should have the same average pitch. That way, the two filter groupings would define the appropriate stop band for pitch averaging Bragg grating 521, while phase shift gap P_SHIFT would provide the reflectivity characteristics within that stop band. Just as described above with respect to FIG. 2B, phase shift gap P_SHIFT is sized to introduce a quarter wavelength phase shift between filter groupings 521-1 and 521-2. Therefore, if filter groupings 221-1 and 221-2 have average pitch values equal to Pavg, then phase shift gap P_SHIFT could be set equal to 1.5 times Pavg.

Typically, phase shift gap P_SHIFT will be significantly larger than any of the pitch values within filter grouping 221-1 and 221-2 (roughly 1.5 times larger, as described above). However, according to another embodiment of the invention, a pitch averaging Bragg grating could include multiple phase shift gaps that divide the Bragg grating into multiple filter groupings. Each of the phase shift gaps can then be selected to be a multiple of a minimum tool resolution, wherein the average of the multiple phase shift gaps is substantially equal to 1.5 times the average pitch value of the filter groupings.

Note that while phase shift gap P_SHIFT could be sized to be exactly equal to 1.5 times the average pitch value Pavg, according to another exemplary embodiment of the invention, phase shift gap P_SHIFT can be sized to be a multiple of the minimum placement resolution of the production tool to be used to produce pitch averaging Bragg grating 521. By sizing phase shift gap P_SHIFT in this manner (i.e., defining an "on-grid" phase shift gap), filter groupings 521-1 and 521-2 can be formed in a single writing pass.

Note that the minimum placement resolution of the production tool will generally allow the selection of an on-grid phase shift gap that is substantially equal to the "ideal" phase shift gap (i.e., 1.5 times the Pavg). For example, referring to spectrum S1 described in Table 1 and shown in FIG. 4B, the ideal phase shift gap would be 359.28 (=1.5*239.52). An on-grid phase shift gap of 360 nm could then be selected for a production tool having a minimum placement resolution of 10 nm. Note that the allowable deviation from the ideal phase shift gap will depend on the performance requirements of pitch averaging Bragg grating 521. For example, for wavelengths on the ITU grid, acceptable phase shifting operation can be provided by an on-grid phase shift gap the is within 1 nm of the ideal phase shift gap.

Note that according to an embodiment of the invention, the particular pitch distributions for filter grouping 521-1 and/or filter grouping 521-2 can be adjusted to correct for any phase shift errors caused by the slight deviation of phase shift gap P_SHIFT (on-grid) from the ideal phase shift gap. Note further that the resulting (adjusted) pitch distributions could therefore be different for filter grouping 521-1 and 521-2, although the average pitch values for both pitch distributions would be substantially the same.

Figure 6A:
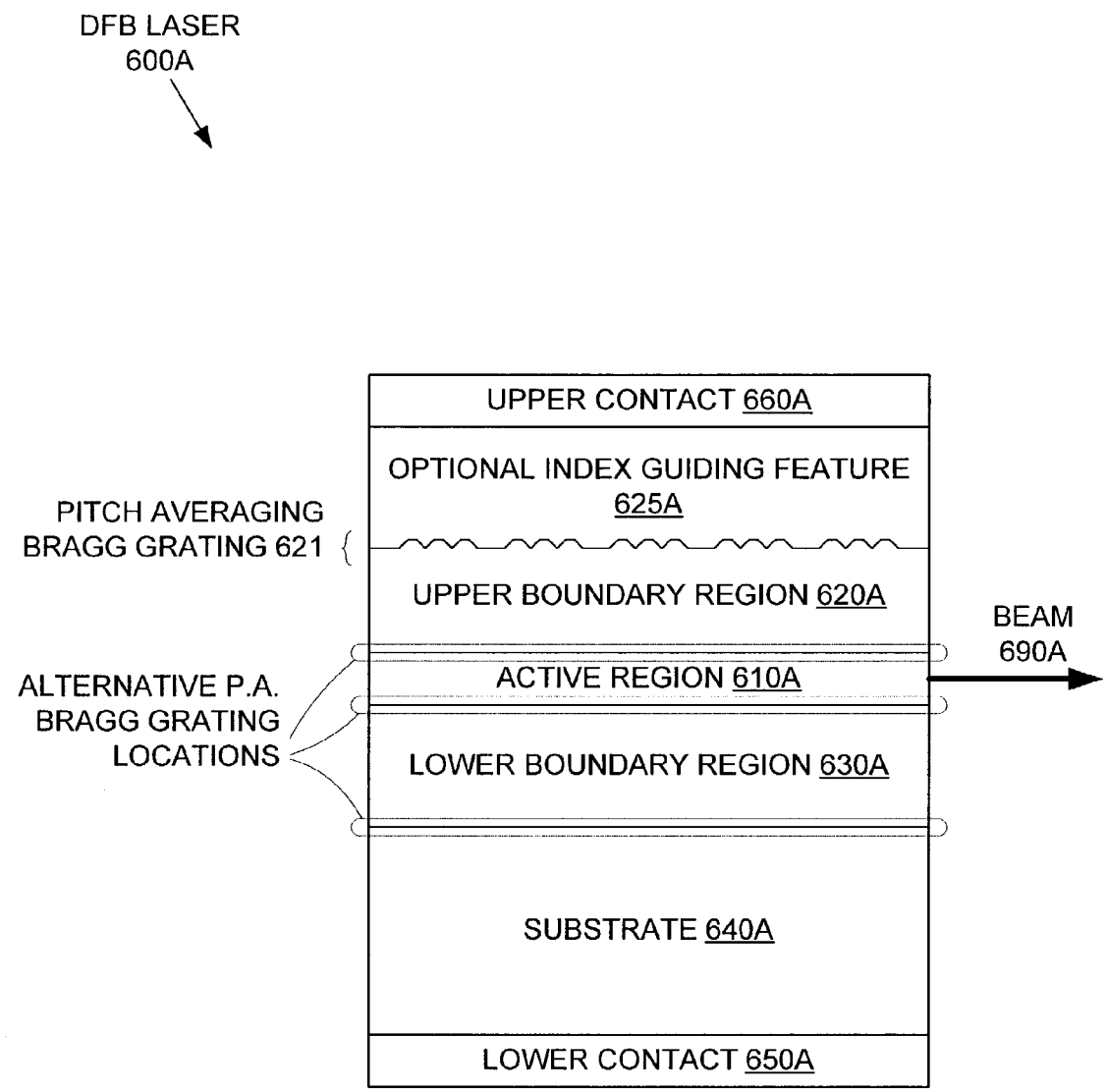
FIG. 6A is a diagram of a DFB laser including a pitch averaging Bragg grating, in accordance with another embodiment of the invention.

FIG. 6A shows a DFB laser 600A that incorporates a pitch averaging Bragg grating in accordance with another embodiment of the invention. DFB laser 600A includes an active region 610A (such as a doped semiconductor layer or series of quantum well layers) surrounded by an upper boundary region 620A and a lower boundary region 630A. Upper boundary region 620A includes a pitch averaging Bragg grating 621, such as pitch averaging Bragg grating 321 shown in FIG. 3A or pitch averaging Bragg grating 521 shown in FIG. 5.

Note that pitch averaging Bragg grating 621 can be located in various positions adjacent to active region 610A and still provide the desired filtering. Examples of alternative pitch averaging Bragg grating locations are indicated by the dotted ovals. Note further that upper boundary region 620A can also include an optional index guiding feature 625A (such as a ridge or groove) to provide guiding of the light within active region 610A.

An upper contact 660A is formed over upper boundary region 620A. Lower boundary region 630A is formed on a substrate 640A, and a lower contact 650A is formed on the bottom surface of substrate 640A. When sufficient current flows between upper contact 660A and lower contact 650A, lasing occurs in active region 610A and a laser beam 690A is emitted. The wavelength of laser beam 690A is controlled by the average pitch of pitch averaging Bragg grating 625A. Because pitch averaging Bragg grating 625A incorporates a pitch distribution that can be based on the minimum placement resolution(s) of actual production tools, DFB laser 600A can be produced much more easily than conventional DFB lasers that incorporate constant pitch Bragg gratings. Note that the particular design of DFB laser 600A is exemplary only. Other DFB laser structures may be used with the pitch averaging Bragg grating of the invention.

Figure 6B:
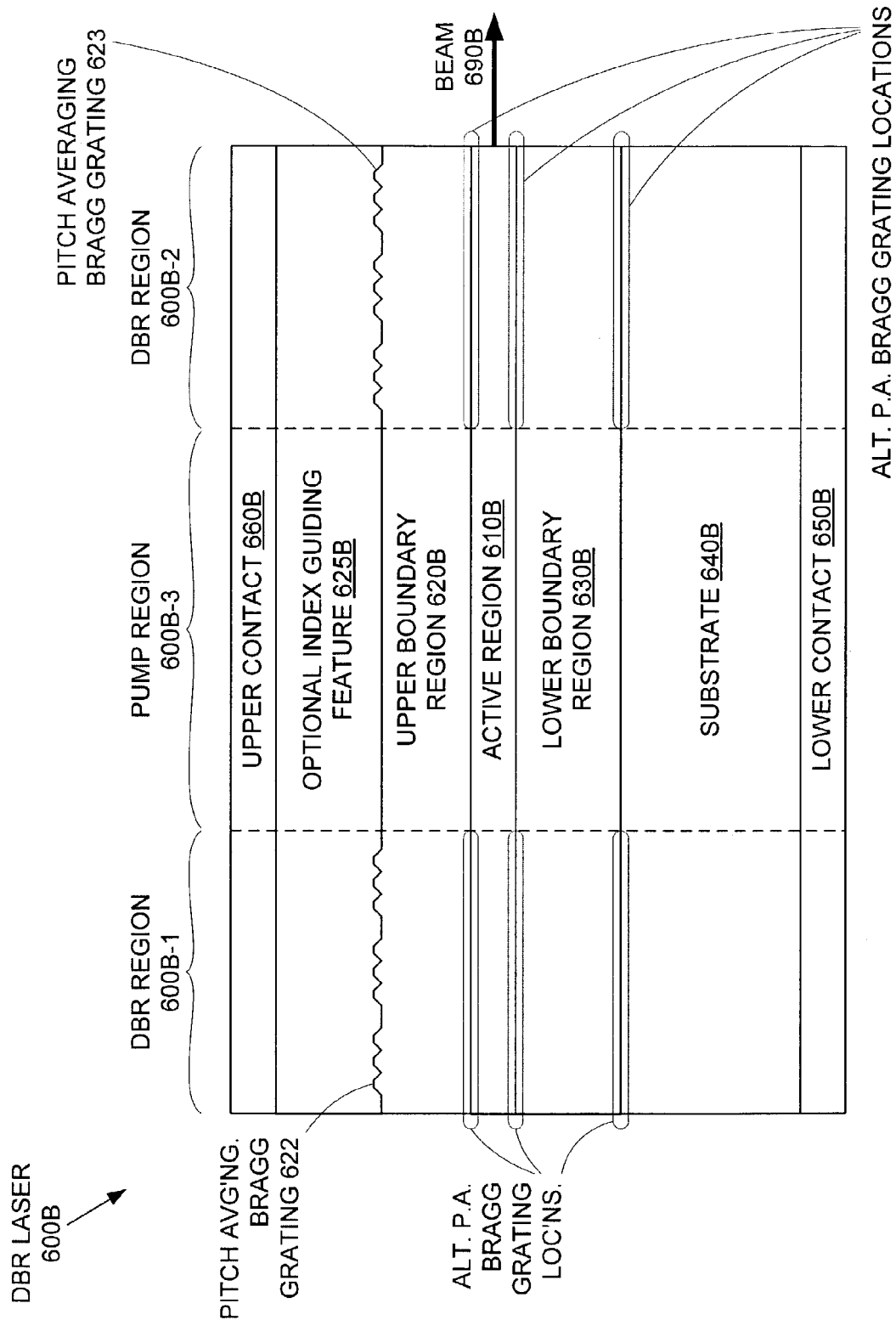
FIG. 6B is a diagram of a DBR laser including a pitch averaging Bragg grating, in accordance with another embodiment of the invention.

FIG. 6B shows a distributed Bragg reflector (DBR) laser 600B that incorporates pitch averaging Bragg gratings in accordance with another embodiment of the invention. DBR laser 600B includes an active region 610B surrounded by an upper boundary region 620B and a lower boundary region 630B, which is in turn formed on a substrate 640B. An upper contact 660B is provided on upper boundary region 620B and a lower contact 650B is provided on the bottom of substrate 640B.

A DBR laser is similar to a DFB laser, except that instead of using the cleaved ends of the lasing region to provide the resonant cavity, the DBR laser uses a Bragg grating at each end of the active region. Therefore, as indicated by the dashed lines, DBR laser 600B can be divided into three regions—two DBR regions 600B-1 and 600B-2, and a pump region 600B-3. The portions of upper boundary region 620B in DBR regions 600B-1 and 600B-2 include a pitch averaging Bragg grating 622 and a similar pitch averaging Bragg grating 623, respectively. Examples of alternative locations for pitch averaging Bragg gratings 622 and 623 are indicated by the dotted ovals. The portion of upper boundary region 620B in pump region 600B-3 can include an optional index guiding feature 625B. Because pitch averaging Bragg gratings 622 and 623 only reflect light of a certain wavelength, only light of that frequency can lase within active region 610B (in pump region 600B-3) to generate laser beam 690B. Just as with DFB laser 600A shown in FIG. 6A, the use of pitch averaging Bragg gratings in DBR laser 600B can greatly simplify the manufacturing process by eliminating the need for special tool calibrations and adjustments.

Pitch averaging Bragg gratings can also be incorporated into any type of multi-wavelength system. As noted above with respect to FIG. 4, pitch averaging Bragg gratings can be manufactured concurrently or consecutively, even if the pitch averaging Bragg gratings have different average pitch values. Therefore, multi-wavelength systems that are formed on a single die can see a substantial decrease in manufacturing complexity by incorporating pitch averaging Bragg gratings.

Figure 7:
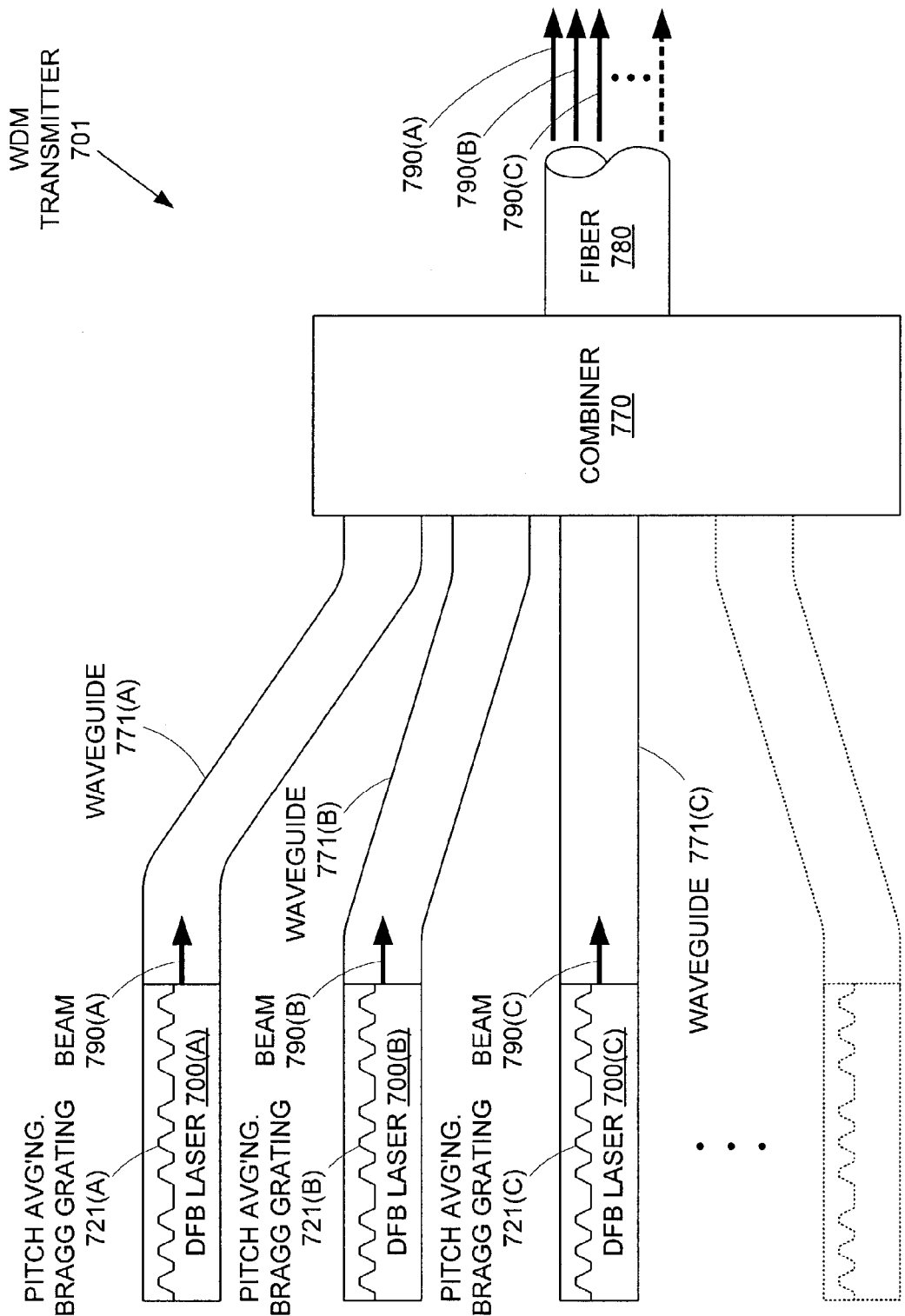
FIG. 7 is a diagram of a WDM transmitter including pitch averaging Bragg gratings, in accordance with another embodiment of the invention.

For example, FIG. 7 shows a WDM transmitter 701 in accordance with an embodiment of the invention. WDM transmitters transmit multiple optical signals of different wavelengths across a single fiber. Because the optical signals are all at different wavelengths, the data integrity for each optical signal can be maintained. WDM transmitter 701 includes DFB lasers 700(A), 700(B), and 700(C), each of which includes a pitch averaging Bragg grating 721(A), 721(B), and 721(C), respectively. Laser beams (of different wavelengths) 790(A), 790(B), and 790(C) emitted by DFB lasers 700(A), 700(B), and 700(C), respectively, are guided to a combiner 770 by waveguides 771(A), 771(B), and 771(C), respectively. Note that, while three DFB lasers are shown for explanatory purposes, WDM transmitter 701 can include any number of DFB lasers and associated waveguides, as indicated by the dotted outlines. Combiner 770 then combines laser beams 790(A), 790(B), and 790(C) and feeds them into optical fiber 780 to be transmitted to other WDM components.

Figure 8:
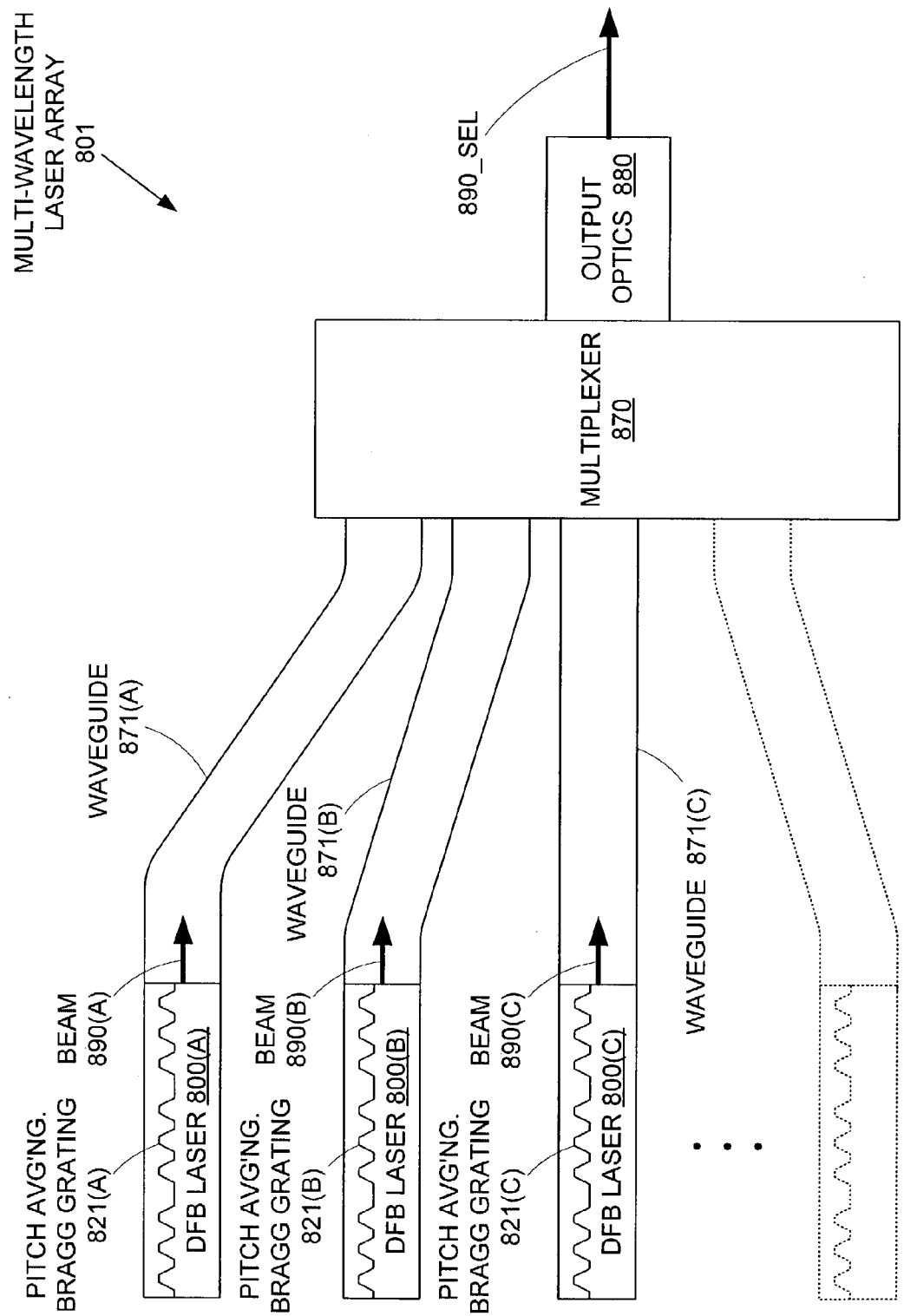
FIG. 8 is a diagram of a multi-wavelength laser array including pitch averaging Bragg gratings, in accordance with another embodiment of the invention.

FIG. 8 shows a multi-wavelength laser array 801 in accordance with another embodiment of the invention. Multi-wavelength laser arrays are a type of tunable laser that can emit laser beams of different selectable wavelengths. Multi-wavelength laser array 801 includes DFB lasers 800 (A), 800(B), and 800(C), each of which includes a pitch averaging Bragg grating 821(A), 821(B), and 821(C), respectively. Laser beams (of different wavelengths) 890(A), 890(B), and 890(C) emitted by DFB lasers 800(A), 800(B), and 800(C), respectively, are guided to a multiplexer 870 by waveguides 871(A), 871(B), and 871(C), respectively. Note that, while three DFB lasers are shown for explanatory purposes, multi-wavelength laser array 801 can include any number of DFB lasers and associated waveguides, as indicated by the dotted outlines. Multiplexer 870 then selects one of laser beams 790(A), 790(B), and 790(C) (and any other input beams) and emits that beam from output optics 880 as a selected laser beam 890_SEL.

Figure 9:
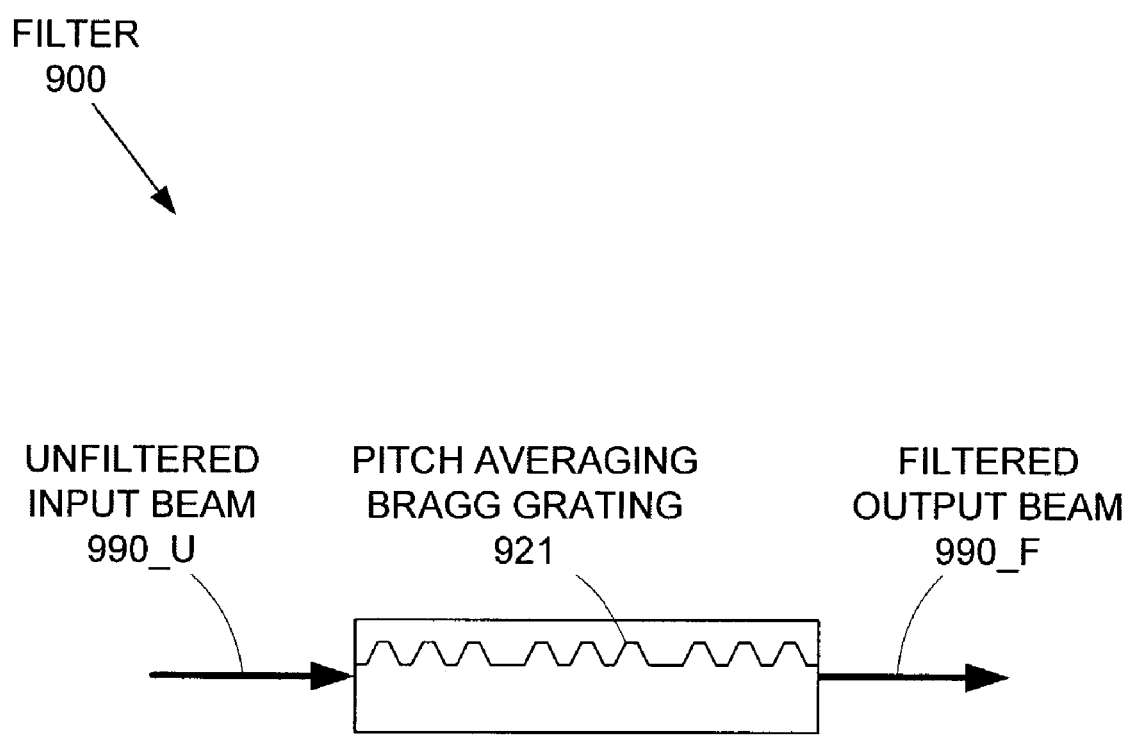
FIG. 9 is a diagram of an optical spectral filter including a pitch averaging Bragg grating, in accordance with another embodiment of the invention.

Pitch averaging Bragg gratings can also be incorporated into any optical element that could use a conventional constant pitch Bragg grating. For example, FIG. 9 shows a basic optical spectral filter 900 in accordance with an embodiment of the invention. Filter 900 includes a pitch averaging Bragg grating 921 that filters a selected wavelength of light from an input unfiltered beam 990_U to generate a filtered output beam 990_F.

The various embodiments of the structures and methods of this invention that are described above are illustrative only of the principles of this invention and are not intended to limit the scope of the invention to the particular embodiments described. For example, a pitch-averaging Bragg grating methodology can be applied to higher order wavelengths than the fundamental wavelength. Thus, the invention is limited only by the following claims and their equivalents.

The invention claimed is:

1. A method for creating Bragg gratings, the method comprising:
   determining a first target constant pitch for a first Bragg grating; and
   defining a first pitch distribution for a first filter grouping of grating peaks for the first Bragg grating, the first pitch distribution specifying a first plurality of pitch values, wherein the first pitch distribution has a first average pitch substantially equal to the first target constant pitch, and wherein the first filter grouping of grating peaks does not include any phase shift gaps;
   selecting a production tool for producing the first Bragg grating; and
   determining a minimum placement resolution for the production tool, wherein each of the first plurality of pitch values is a multiple of the minimum placement resolution.

2. The method of claim 1, wherein the first pitch distribution includes at least three different pitch values.

3. The method of claim 1, wherein the first pitch distribution includes at least four instances of a first pitch value and at least four instances of a second pitch value, the first pitch value being different from the second pitch value.

4. The method of claim 1, further comprising:
   defining a second pitch distribution for a second filter grouping of grating peaks for the first Bragg grating, the second pitch distribution specifying a second plurality of pitch values, wherein the second pitch distribution has a second average pitch substantially equal to the first target constant pitch, and wherein the second filter grouping of grating peaks does not include any phase shift gaps; and
   spacing the second filter grouping of grating peaks from the first filter grouping of grating peaks by a phase shift gap, the phase shift gap introducing a quarter wavelength shift between the first filter grouping of grating peaks and the second filter grouping of grating peaks.

5. The method of claim 4, wherein the second average pitch is equal to the first average pitch.

6. The method of claim 1, further comprising:
   writing a pattern on a die for the first Bragg grating in a single writing pass using the production tool.

7. The method of claim 1, further comprising:
   defining a plurality of pitch distributions for a plurality of filter groupings of grating peaks for the first Bragg grating, each of the plurality of pitch distributions specifying a plurality of pitch values, wherein each of the plurality of pitch distributions has an average pitch substantially equal to the first target constant pitch, and wherein the plurality of pitch distributions do not include any phase shift gaps; and
   spacing the plurality of filter groupings of grating peaks from each other and the first filter grouping of grating peaks by a plurality of phase shift gaps, wherein each of the plurality of phase shift gaps is a multiple of the minimum placement resolution, and wherein an average of the plurality of phase shift gaps is substantially equal to 1.5 times the first target constant pitch.

8. The method of claim 1, further comprising:
   determining a second target constant pitch for a second Bragg grating; and
   defining a second pitch distribution for a second filter grouping of grating peaks for the second Bragg grating, the second pitch distribution specifying a second plurality of pitch values, wherein the second pitch distribution has a second average pitch substantially equal to the second target constant pitch, and wherein the second filter grouping of grating peaks does not include any phase shift gaps.

9. The method of claim 8, further comprising: using the production tool to produce the second Bragg grating, wherein each of the second plurality of pitch values are multiples of the minimum placement resolution.

10. The method of claim 9, wherein the first target constant pitch is equal to the second target constant pitch, the method further comprising:
    defining a target phase shift gap substantially equal to 1.5 times the first target constant pitch;
    spacing the second filter grouping of grating peaks from the first filter grouping of grating peaks by an adjusted phase shift gap, the adjusted phase shift gap being substantially equal to the phase shift gap, the adjusted phase shift gap being a multiple of the minimum placement resolution.

11. The method of claim 9, further comprising writing the first Bragg grating and the second Bragg grating on a single wafer in a single writing pass using the production tool.

12. A Bragg grating for filtering a target wavelength, the Bragg grating comprising:
  a first plurality of grating peaks, the first plurality of grating peaks being spaced by a first plurality of pitch values, the first plurality of pitch values having a first average pitch substantially equal to a target pitch, wherein the first plurality of grating peaks does not include any phase shift gaps, wherein the target wavelength is a Bragg wavelength for the target pitch, and wherein each of the first plurality of pitch values is a multiple of a minimum placement resolution for a production tool used to produce the Bragg grating.

13. The Bragg grating of claim 12, wherein the first plurality of pitch values comprises at least three different pitch values.

14. The Bragg grating of claim 12, wherein the first plurality of pitch values includes at least four instances of a first pitch value and at least four instances of a second pitch value, the first pitch value being different from the second pitch value.

15. The Bragg grating of claim 12, further comprising:
  a second plurality of grating peaks, the second plurality of grating peaks being spaced by a second plurality of pitch values, the second plurality of pitch values having a second average pitch substantially equal to a target pitch,
  wherein the second plurality of pitch values does not include any phase shift gaps, and
  wherein the second plurality of grating peaks is spaced from the first plurality of target peaks by a phase shift gap that is equal to 1.5 times the target pitch.

16. The Bragg grating of claim 12, further comprising:
  a second plurality of grating peaks, the second plurality of grating peaks being spaced by a second plurality of pitch values, the second plurality of pitch values having a second average pitch substantially equal to a target pitch,
  wherein the second plurality of pitch values does not include any phase shift gaps,
  wherein each of the first plurality of pitch values and each of the second plurality of pitch values is a multiple of the first value, and
  wherein the second plurality of grating peaks is spaced from the first plurality of target peaks by a phase shift gap that is substantially equal to 1.5 times the target pitch, the phase shift gap being a multiple of the first value.

17. An optical device comprising:
  a first Bragg grating comprising a first plurality of grating peaks, the first plurality of grating peaks being spaced by a plurality of pitch values
  wherein a first average of the plurality of pitch values is substantially equal to a target pitch, and wherein the first plurality of grating peaks does not include any phase shift gaps, and wherein each of the first plurality of pitch values is a multiple of a minimum placement resolution for a production tool used to produce the first Bragg grating.

18. The optical device of claim 17, device is a distributed feedback laser.

19. The optical device of claim 17, wherein the optical device is a distributed Bragg reflector laser.

20. The optical device of claim 17, wherein the optical device is an optical spectral filter for a selected wavelength of light, the selected wavelength of light being a Bragg wavelength for the target pitch.

21. An optical system comprising:
  a first laser comprising a first Bragg grating, the first Bragg grating comprising a first filter grouping of grating peaks, the first filter grouping of grating peaks being spaced by a first plurality of pitch values, wherein the first filter grouping of grating peaks does not include any phase shift gaps, and wherein each of the first plurality of pitch values is a multiple of a minimum placement resolution for a production tool used to produce the first Bragg grating; and
  a second laser comprising a second Bragg grating, the second Bragg grating comprising a second filter grouping of grating peaks, the second filter grouping of grating peaks being spaced by a second plurality of pitch values, wherein the second filter grouping of grating peaks does not include any phase shift gaps, wherein each of the second plurality of pitch values is a multiple of the minimum placement resolution for the production tool, which is used to produce the second Bragg gratings.

22. The optical system of claim 21, wherein the first Bragg grating further comprises a third filter grouping of grating peaks, the third filter grouping of grating peaks being spaced by a third plurality of pitch values,
  wherein the third filter grouping of grating peaks does not include any phase shift gaps,
  wherein the third plurality of pitch values has a third average pitch substantially equal to the first target pitch, and
  wherein first filter grouping is spaced from the third filter grouping by a phase shift gap, the phase shift gap being substantially equal to 1.5 times the first target pitch.

23. The optical system of claim 21, wherein the optical system is a wavelength division multiplexing system, and wherein the optical system further comprises a combiner for feeding the first laser beam and the second laser beam into a fiber.

24. The optical system of claim 21, wherein the optical system is a multi-wavelength laser array, and wherein the optical system further comprises a multiplexer for selecting between the first laser beam and the second laser beam as an output of the multi-wavelength laser array.

25. The optical system of claim 21, wherein the first plurality of pitch values has a first average pitch substantially equal to a first target pitch, the first laser generating a first laser beam at a first wavelength, the first wavelength being a first Bragg wavelength for the first target pitch, and
  wherein the second plurality of pitch values has a second average pitch substantially equal to a second target pitch, the second target pitch being different from the first target pitch, the second laser generating a second laser beam at a second wavelength, the second wavelength being a second Bragg wavelength for the second target pitch.

26. The optical device of claim 17, further comprising:
  an active region for generating light, the first Bragg grating being configured to reflect a first wavelength of light back into the active region, the first wavelength of the light being a Bragg wavelength for the target pitch.

* * * * *